United States Patent [19]

Satoh et al.

[11] Patent Number: 5,576,564
[45] Date of Patent: Nov. 19, 1996

[54] FERROELECTRIC THIN FILM WITH INTERMEDIATE BUFFER LAYER

[75] Inventors: Sakiko Satoh; Hironori Matsunaga; Kenji Nakanishi; Yoshiyuki Masuda, all of Chiba-ken; Masayoshi Koba, Nara-ken, all of Japan

[73] Assignee: Sharp Kabushiki Kaisha, Osaka, Japan

[21] Appl. No.: 365,542

[22] Filed: Dec. 28, 1994

[30] Foreign Application Priority Data

Dec. 28, 1993 [JP] Japan ................................. 5-350258

[51] Int. Cl.$^6$ ................................................. H01L 29/76
[52] U.S. Cl. ........................ 257/295; 257/310; 257/325
[58] Field of Search .......................... 257/295, 43, 310, 257/325

[56] References Cited

U.S. PATENT DOCUMENTS

| | | | |
|---|---|---|---|
| 3,808,674 | 5/1974 | Francombe et al. | 257/415 |
| 5,128,007 | 7/1992 | Matsunaga et al. | 204/192.13 |
| 5,146,299 | 9/1992 | Lampe et al. | 365/145 |

FOREIGN PATENT DOCUMENTS

| | | |
|---|---|---|
| 0568065 | 11/1993 | European Pat. Off. |
| 4133369 | 5/1992 | Japan |
| 0329497 | 11/1994 | Japan |
| 6305897 | 11/1994 | Japan |

OTHER PUBLICATIONS

Shu-Yau Wu, "A New Ferroelectric Memory Device, Metal-Ferroelectric-Semiconductor Transistor", Aug. 1974 pp. 499–503. IEEE Transactions on Electron Devices, vol. ED-21, No. 8.

Database WPI, Section Ch, Week 9507; An 95-048720 and JP-A-06 329 497, Nov. 1994. Abstract.

"Structural and Electric Studies . . . Metallo-Organic Solution Deposition", by P.C. Joshi et al, Journal of Applied Physics Dec. 15, 1992 pp. 5827–5833.

"Ferroelectric Bismuth Titanate Films by Hot Walls Metalorganic Chemical Vapor Deposition", by J. Si et al, Journal of Applied Physics, Jun. 1, 1993, pp. 7910–7913.

Primary Examiner—Robert P. Limanek
Assistant Examiner—David B. Hardy

[57] ABSTRACT

The present invention provides a substrate providing a ferroelectric crystal thin film which includes an electrode formed on a semiconductor single crystal substrate and a ferroelectric crystal thin film of $Bi_4Ti_3O_{12}$ formed on the electrode through the intermediary of a buffer layer.

6 Claims, 5 Drawing Sheets

TEMPERATURE OF SUBSTRATE (°C)

FERROELECTRIC THIN FILM WITH INTERMEDIATE BUFFER LAYER

BACKGROUND OF THE INVENTION

1. Field of the Invention

The present invention relates to a substrate providing a ferroelectric crystal thin film, its production method and a device using said substrate. In particular, it relates to the substrate providing a ferroelectric crystal thin film used for a non-volatile memory device of ferroelectrics, a pyroelectric infrared sensor, a piezoelectric device and the like, its production method and a device using the substrate.

2. Description of the Related Art

Since a ferroelectric crystal has a lot of characteristics such as spontaneous poralization, high dielectric constant, electro-optic effect, piezoelectric effect, pyroelectric effect and the like, it is applied for many kinds of devices such as a capacitor, oscillator, optical modulator, infrared sensor and the like. In case of application for these devices, the ferroelectric crystal has been used in the form of a single crystal or ceramics. However, in accordance with a development of high quality ferroelectric thin film prepared by various methods such as vacuum evaporation, sputtering, CVD (Chemical Vapor Deposition) method, sol-gel method and the like, an application different from the conventional cases using the bulk material has been expected.

Recently, it was found that a ferroelectric non-volatile random access memory (FNVRAM) can be obtained with high density and high speed by a combination of the ferroelectric crystal with a semiconductor memory such as DRAM, and the study for such a device has been proceeding.

It is necessary for the development of the device to provide a high quality thin film in which remanent spontaneous polarization (Pr) is great, coercive field (Ec) is small, a leak electric current is low, and a film thickness is 200 nm or less for reducing a driving voltage and for simplifying a manufacturing process.

Especially, intensive study for materials has been done on PZT ($Pb(Zr_{1-x}Ti_x)O_3$) with which an excellent ferroelectric thin film can be obtained by a sputtering method and the like. However, in spite of the fact that the ferroelectric characteristics of PZT greatly depends on the composition x, the composition easily varies in a step of film formation or thermal treatment because it contains Pb having a high vapor pressure. As a result, a pin hole or uneven surface readily occurs, which causes a leak current or switching fatigue when the film thickness decreases. Accordingly, an attention was drawn to a high quality thin film comprising $Bi_4Ti_3O_{12}$ as a material which has a ferroelectric characteristics similar to PZT and does not contain a substance having a high vapor pressure such as Pb.

The thin film of $Bi_4Ti_3O_{12}$ can be made by a sol-gel method or MOCVD method. However, a thin film conventionally manufactured so far has a difficulty in obtaining a densed film because it comprises crystal particles with a large size and the surface of the film is significantly uneven. Accordingly, leak current increases in accordance with reduced film thickness, so that sufficient ferroelectric characteristics can not be realized.

SUMMARY OF THE INVENTION

The present invention provides a substrate providing a ferroelectric crystal thin film which comprises a semiconductor single crystal substrate, an electrode formed thereon with or without sandwiching at least one insulating film or conductive film, a buffer layer on the electrode and a ferroelectric crystal thin film comprising $Bi_4Ti_3O_{12}$ on the buffer layer.

Alternatively, the present invention provides a method for forming the substrate providing a ferroelectric crystal thin film, which comprises the steps of forming an electrode on a semiconductor single substrate, forming a buffer layer on the electrode and forming a ferroelectric crystal thin film comprising $Bi_4Ti_3O_{12}$ on the buffer layer.

The present invention also provides a device using the substrate providing a ferroelectric crystal thin film of the present invention, in which an upper electrode is formed on the ferroelectric crystal thin film of the substrate.

According to the present invention, the $Bi_4Ti_3O_{12}$ film can exert a high density and have smooth surface, which is useful for development of a device.

PREFERRED EMBODIMENT OF THE INVENTION

Figure 1:
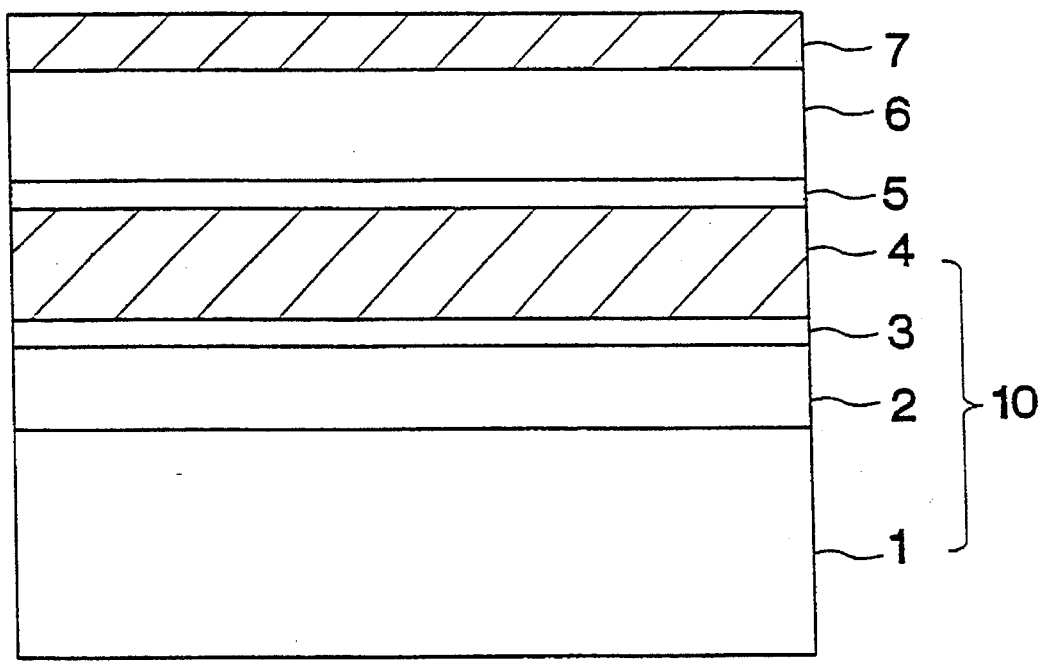
FIG. 1 is a sectional view showing a film structure formed by the method for forming a ferroelectric crystal thin film of the present invention.

As the semiconductor single crystal substrate for the present invention, any material generally used for a substrate may be employed and is not specifically limited. Preferably, a single crystal silicon substrate is used. On the single crystal silicon substrate, the electrode is formed. Before forming the electrode, at least one insulating film and conductive film may be formed on the single crystal silicon substrate. Examples of the insulating film include an oxide film or nitride film. When using a silicon substrate as the semiconductor single crystal substrate, it is preferable to form $SiO_2$ film on the silicon substrate. In that case, $SiO_2$ may be formed by a known method, for example, a thermal oxidation, preferably so as to have a film thickness of about 100 to 300 nm. Examples of the material for the conductive films include Ti, Mo, Ta, W, Ni and Cr, but are not specifically limited to those and a material generally used for an electrode may be used. The conductive film is preferably formed with a film thickness of about 2 to 50 nm. Namely, the electrode is formed on the semiconductor single crystal substrate through the intermediary of the insulating film, the insulating film and conductive film, or directly. The electrodes may be formed of Pt, Au, Ni or Cr, but are not specifically limited to those. The preferred thickness of the electrode is about 100 to 300 nm.

According to the present invention, a ferroelectric crystal thin film comprising $Bi_4Ti_3O_{12}$ is formed on the electrode via a buffer layer. The buffer layer is preferably formed of an element constituting the ferroelectric crystal thin film to be formed thereon. Namely, the buffer layer is preferably formed with a film containing Bi and Ti of which the composition ratio may be varied. The composition ratio may be varied continuously or abruptly, preferably continuously. In specifically, the buffer layer may be formed with a pyrochlore type layer of $Bi_2Ti_2O_7$ or the composition of the buffer layer is varied from $Bi_2Ti_2O_7$ to $Bi_4Ti_3O_{12}$ from the electrode to the ferroelectric crystal thin film. This is because when $Bi_2Ti_2O_7$ having an isotropic pyrochlore structure (cubic system/lattice constant: a=20.68 Å) is used as the buffer layer against $Bi_4Ti_3O_{12}$ having a perovskite layered structure with a strong anisotropy (orthorhombic system/lattice constant: a=5.411 Å, b=5.448 Å, c=32.83 Å), the crystal particles of the $Bi_4Ti_3O_{12}$ formed on $Bi_2Ti_2O_7$ can be minimized in size and the surface thereof can be made smooth. In addition, the elements constituting the buffer layer are identical to that of the ferroelectric crystal thin film, so that the ferroelectric crystal thin film can be prevented from being contaminated with impurity elements which are different from the constituting elements.

The buffer layer and ferroelectric crystal thin film may be formed by various methods such as the sputtering, laser ablation, CVD (or MOCVD) method, sol-gel method and the like. Preferably, the sol-gel method and MOCVD method are used. For example, when the $Bi_2Ti_2O_7$ film or $Bi_4Ti_3O_{12}$ film is formed by the sol-gel method, a metal salt of elements constituting these compounds or alkoxide thereof may be used. Specifically, $(Bi(NO_3)_3 \cdot 5H_2O)$, $(Ti(i-OC_3H_7)_4)$ and the like are mixed in a desired composition ratio, followed by adding water or an alcohol to hydrolyze it, thereby obtaining a sol. A stabilizer and the like may be suitably added to the sol. Then, the sol is applied to a film formation region by, e.g., the spin-coating method. The rate of spinner rotation and other conditions used for coating can be suitably adjusted depending on a viscosity of the sol. Preferably, the sol is applied to a thickness of about 40 to 70 nm at once. After applying the sol to the desired region, it is dried and prebaked. The drying and prebaking are preferably conducted in an air or under an oxygen atmosphere at temperature in the range from 100° C. to 450° C. for a period from 10 to 60 minutes. Thus formed film is in amorphous state, so that it can be suitably crystallized by Rapid Thermal Annealing (RTA) or the like. The film composition of the film comprising $Bi_2Ti_2O_7$ can be varied from $Bi_2Ti_2O_7$ to $Bi_4Ti_3O_{12}$ as follows. First, sols having a different composition are prepared. Then the sols are applied, dried and prebaked, respectively to deposit a plurality of amorphous thin films having a different composition ratio. Owing to thermal treatment under suitable condition, the solid phases are diffused, so that the composition ratio is varied.

If the $Bi_2Ti_2O_7$ film or $Bi_4Ti_3O_{12}$ film is formed by MOCVD method, an organic metal gas containing Bi or Ti is supplied in a suitable flow rate on the substrate which is heated to a temperature such that the organic metal compound is decomposed. The film in which the composition varies from $Bi_2Ti_2O_7$ to $Bi_4Ti_3O_{12}$ can be formed by changing temperature of the substrate in the range from about 550° to 650° C.

An upper electrode is formed with the same material as that of the electrode on the ferroelectric crystal thin film prepared as above, whereby thus formed device can be applied for various kinds of devices such as ferroelectric nonvolatile memory device, pyroelectric infrared sensor, piezoelectric device, capacitor, oscillator, optical modulator and infrared sensor.

In the ferroelectric crystal thin film, it is possible to obtain a densed ferroelectric crystal thin film as formed by the present invention which is dense and has a smooth surface, and which can not be realized by using a single layer of a ferroelectric crystal thin film. This is because the ferroelectric crystal thin film comprising $Bi_4Ti_3O_{12}$ of the present invention is provided through the intermediary of the buffer layer on the electrode formed on the semiconductor single crystal substrate. In other words, the substrate of the present invention employs a paraelectric crystal thin film having a pyrochlore structure which shows an isotropy as a buffer layer against a ferroelectric crystal thin film having a perovskite layered structure which shows a strong anisotropy, whereby crystal particles of the ferroelectric crystal thin film formed thereon can be minimized in size and the smooth surface can be realized.

Alternatively, if the buffer layer is a composite oxide containing Bi and Ti, the ferroelectric crystal film can be prevented from being contaminated with different impurity elements because the elements constituting the buffer layer are the same as that of the ferroelectric crystal thin film.

Moreover, when the buffer layer varies its composition from $Bi_2Ti_2O_7$ to $Bi_4Ti_3O_{12}$ in the direction from the electrode to the ferroelectric crystal thin film, the difference in crystal structure between them may be moderated, thereby improving the smoothness of the surface.

The substrate providing the ferroelectric crystal thin film of the present invention comprises the buffer layer on the electrode formed on the semiconductor single crystal substrate and the ferroelectric crystal thin film comprising $Bi_4Ti_3O_{12}$ on the buffer layer. As the result, crystal particles are minimized in size and the ferroelectric crystal thin film can be formed with a smooth surface.

The present invention is described in detail with reference to Examples as follows. However, they are not intended to limit the scope of the invention thereto.

Example 1

As shown in FIG. 1, a substrate (10) providing a ferroelectric crystal thin film comprises a silicon single crystal wafer (1), a thermal oxidation layer (2) formed on the surface of the wafer (1) with a thickness of 200 nm, a Pt lower electrode (4) with a thickness of 200 nm on the thermal oxidation layer (2) sandwiching the Ti adhesion layer (3) with a film thickness of 30 nm, a buffer layer (5) and a $Bi_4Ti_3O_{12}$ thin film (6) as a ferroelectric crystal thin film.

A device was formed on the substrate (10) providing a ferroelectric crystal thin film by forming an upper electrode (7) on the above ferroelectric crystal thin film.

A method for forming the substrate (10) and a device using the same is described as follows.

First, the thermal oxide layer (2) was formed with a thickness of 200 nm on the surface of silicon single crystal wafer (1) by a thermal oxidation, followed by forming the Pt lower electrode (4) thereon with a thickness of 200 nm sandwiching the Ti adhesion layer (3) having a film thickness of 30 nm.

The buffer layer (5) and the $Bi_4Ti_3O_{12}$ thin film (6) as the ferroelectric crystal thin film were formed on the substrate (10) by a sol-gel method.

As materials for a sol, bismuth nitrate hydrate $(Bi(NO_3)_3 \cdot 5H_2O)$ and titanium isopropoxide $(Ti(i-OC_3H_7)_4)$ were used, and 2-methoxyethanol (CH₃OCH₂CH₂OH) and glacial acetic acid were used as a solvent.

After dissolving bismuth nitrate hydrate in glacial acetic acid, titaniumisopropoxide was mixed in a suitable amount. Then, 2-methoxyethanol was further added to adjust a viscosity of a solution, thereby forming a material solution for film formation. Diethanolamine (DEA) was used as a stabilizer for the sol. Thus prepared sol of which composition ratio is Bi:Ti=1:1 was spin-coated on the substrate (10) by 5000 rpm for 20 seconds, dried at 115° C. for 15 minutes, and prebaked at 400° C. for 60 minutes to remove the organic components. The X-ray diffraction pattern showed that thus obtained film was amorphous.

Next, the obtained film was crystallized by RTA at 600° C. for 15 seconds under an oxygen atmosphere to form the buffer layer (5). The X-ray diffraction pattern of this layer (5) showed a pyrochlore phase ($Bi_2Ti_2O_7$) and the film thickness was about 50 nm.

Figure 2:
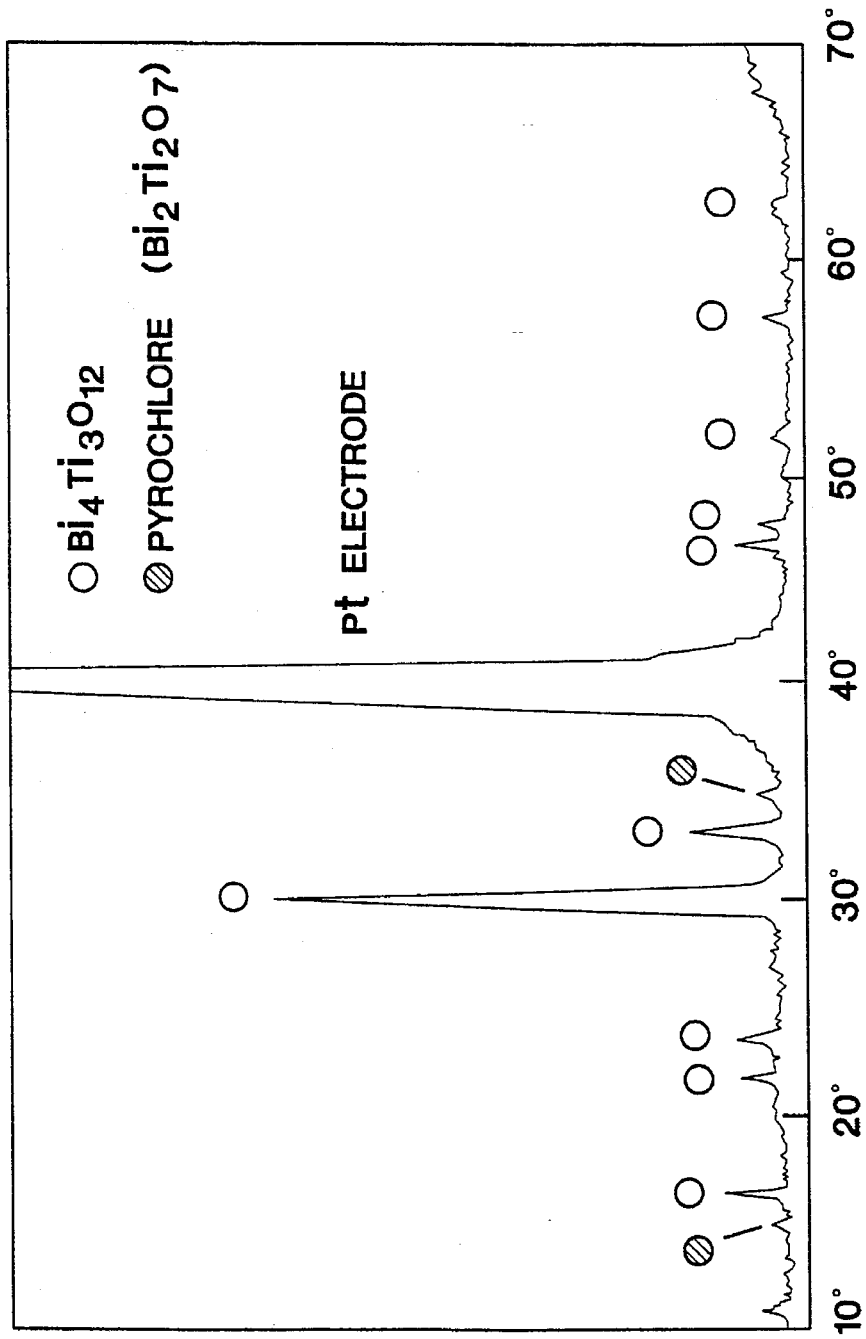
FIG. 2 shows an X-ray diffraction pattern of a ferroelectric layer formed in Example 1.

In the same manner as described above, a sol having a composition ratio of Bi:Ti=4:3 which was prepared in the same manner as above was spin-coated on the buffer layer (5) of the pyrochlore phase, dried and prebaked repeatedly for three times. Then, it was crystallized at 650° C. for 15 seconds under an oxygen atmosphere by RTA. FIG. 2 shows the X-ray diffraction pattern after crystallization. In addition to the pyrochlore phase buffer layer (5), diffraction peak of $Bi_4Ti_3O_{12}$ thin film (8) was confirmed, which showed that the resulting film was a random orientation film. The thickness of $Bi_4Ti_3O_{12}$ (6) thin film was about 180 nm and the total thickness of the oxide film was about 230 nm.

Next, the Pt electrode (7) was formed with a film thickness of about 100 nm on the $Bi_4Ti_3O_{12}$ thin film (6).

Figure 3:
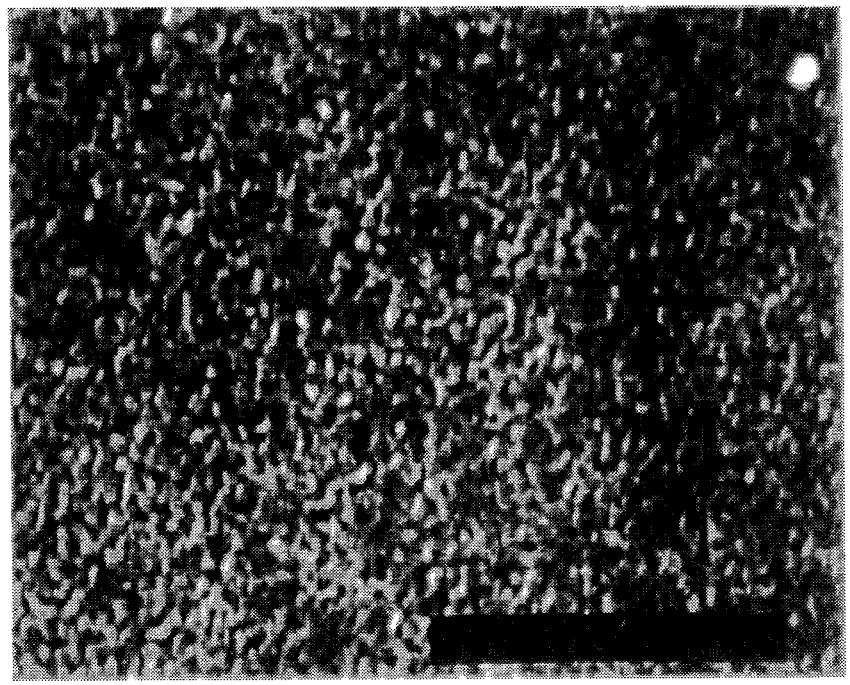
FIG. 3 is an SEM photograph showing a ferroelectric thin film formed in Example 1.
Figure 4:
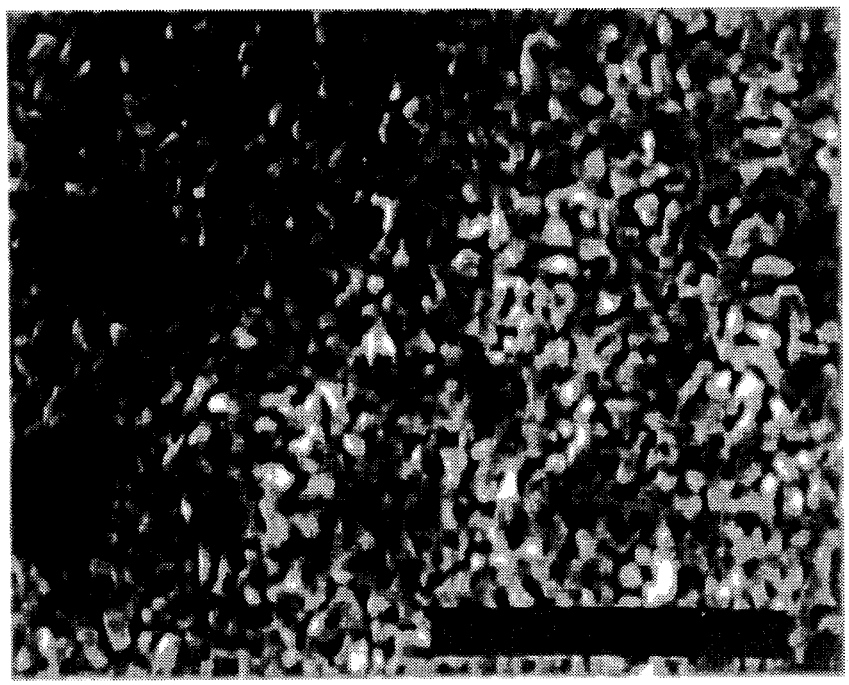
FIG. 4 is an SEM photograph showing a ferroelectric thin film formed as a comparative example of Example 1.

FIG. 3 shows an SEM photograph of the surface of the $Bi_4Ti_3O_{12}$ thin film (6) prepared as described above. FIG. 4 shows an SEM photograph of the surface of the $Bi_4Ti_3O_{12}$ thin film to compare the case where the $Bi_4Ti_3O_{12}$ thin film was formed on the substrate (10) directly without sandwiching the buffer layer (5).

As is clearly shown in FIGS. 3 and 4, crystal particles can be minimized in size and the film can be densed by incorporating the buffer layer (5).

In the measurement of the obtained film with atomic force microscope (AFM) microscope, an average roughness (Ra) of the surface of the obtained film was about 23 nm if it is formed without the buffer layer (5) and was about 15 nm if it is formed with the buffer layer (5). It is clearly that the surface smoothness was improved by forming the buffer layer (5).

Figure 5:
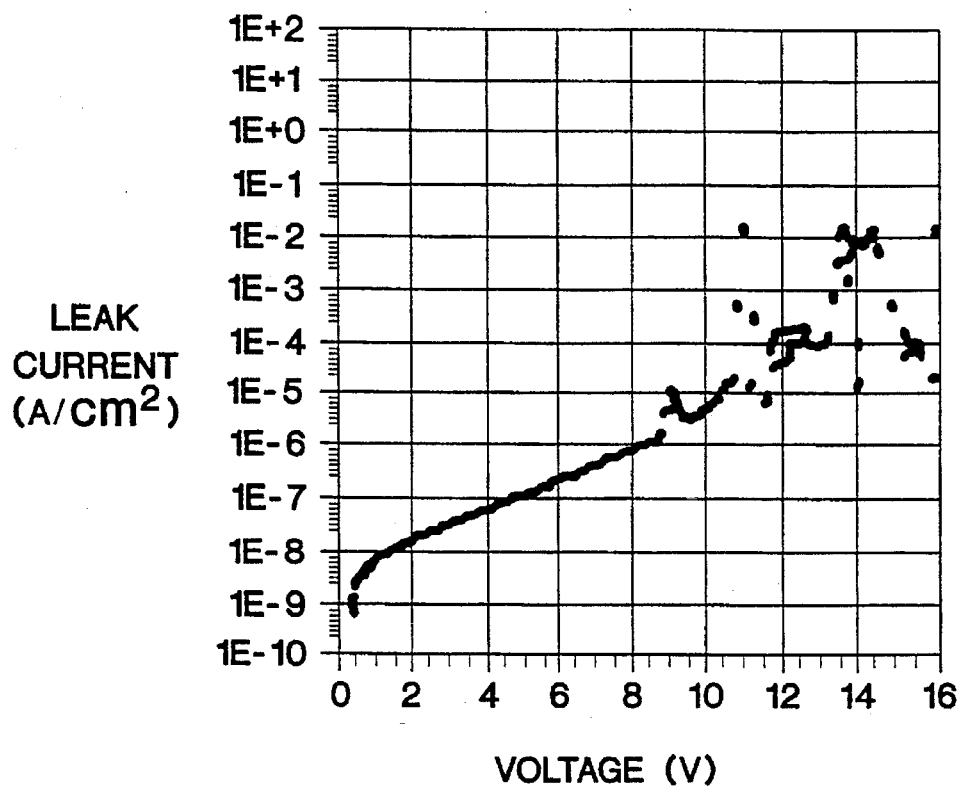
FIG. 5 shows electric current-voltage properties of the ferroelectric thin film formed in Example 1.

The effect of obtaining densed and smooth $Bi_4Ti_3O_{12}$ thin film advantageously affects improvement of an electric characteristics of the film. FIG. 5 shows a characteristic of an electric current and voltage (I–V) of the $Bi_4Ti_3O_{12}$ thin film (6) in case where the $Bi_4Ti_3O_{12}$ thin film (6) was formed on the buffer layer (5) and the Pt upper electrode (7) was formed thereon. When the film was not provided with the buffer layer (5), the leak current was in the order of $10^{-3}$ A/cm² to electric voltage of 2 V. In contrast, the film was provided with the buffer layer (5), the leak current was reduced to the order of $10^{-8}$ A/cm².

Figure 6:
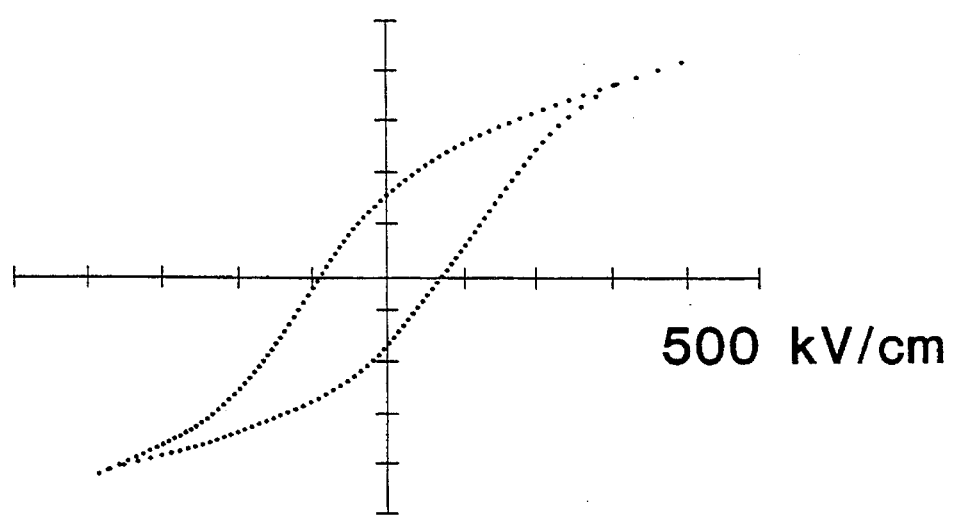
FIG. 6 shows a hysteresis loop of the ferroelectric thin film formed in Example 1.

FIG. 6 shows a hysteresis loop of the $Bi_4Ti_3O_{12}$ thin film when the $Bi_4Ti_3O_{12}$ thin film (6) formed on the buffer layer (5). As seen from the FIG. 6, remanent polarization was about 8 μC/cm², which was greater than those formed by the conventional sol-gel method as reported. Incidentally, if the buffer layer (5) is not formed, the leak current was too great to observe the hysteresis.

Example 2

In the same manner as in Example 1, sols having a composition ratio of Bi:Ti=1:1 and 4:3 were used with the same substrate (10) as Example 1.

First, the sols which were used in Example 1 was diluted to have a ½ concentration and were used for forming a buffer layer of this Example. After the sol having the composition ratio of Bi:Ti=1:1 was coated on the substrate at 1 time, it was dried and prebaked. Then, sol having the composition ratio of Bi:Ti=4:3 was spin-coated at 1 time, dried and prebaked, then in an oxygen atmosphere at 600° C. for 15 seconds by ETA to crystallize, thereby forming the buffer layer. The X-ray diffraction pattern of the buffer layer showed a pyrochlore phase ($Bi_2Ti_2O_7$). The thickness of the buffer layer was about 80 nm. In this step, it is inferred that the composition of the entire film varied from $Bi_2Ti_2O_7$ to $Bi_4Ti_3O_{12}$ continuously because of the solid phase diffusion by the thermal treatment of the deposited film having a different compositions of amorphous thin film. Actually, it was confirmed that the composition ratio of Bi:Ti was continuously changed in the direction of film thickness by the measurement of composition distribution in the direction of the depth of the film by Auger electron spectroscopy (AES).

Then, in the same manner as Example 1, the $Bi_4Ti_3O_{12}$ thin film was formed on the buffer layer and crystallized by RTA.

The observation of the surface of the resulting film by SEM shows that the smoothness of the surface morphology is as good as Example 1.

Example 3

A film was formed by MOCVD method using the substrate (10) prepared in Example 1.

The CVD apparatus used for this Example comprises a vertical reaction chamber in which a substrate heating holder is placed horizontally, a substrate held on the holder and a nozzle formed over the substrate. The film is deposited by flowing a source gas from the nozzle onto substrate.

As the source material, o-tolylbismas $Bi(o-C_7H_8)_3$ and titanium-isopropoxide $Ti(i-OC_3H_7)_4$ were used, and Ar as a carrier gas and $O_2$ as a reaction gas. <Film forming condition>

Bi material: 180° C., Gas flow of 300 sccm.

Ti material: 40° C., Gas flow of 200 sccm.

$O_2$ material: Gas flow of 1000 sccm.

Pressure: 5 Torr.

Figure 7:
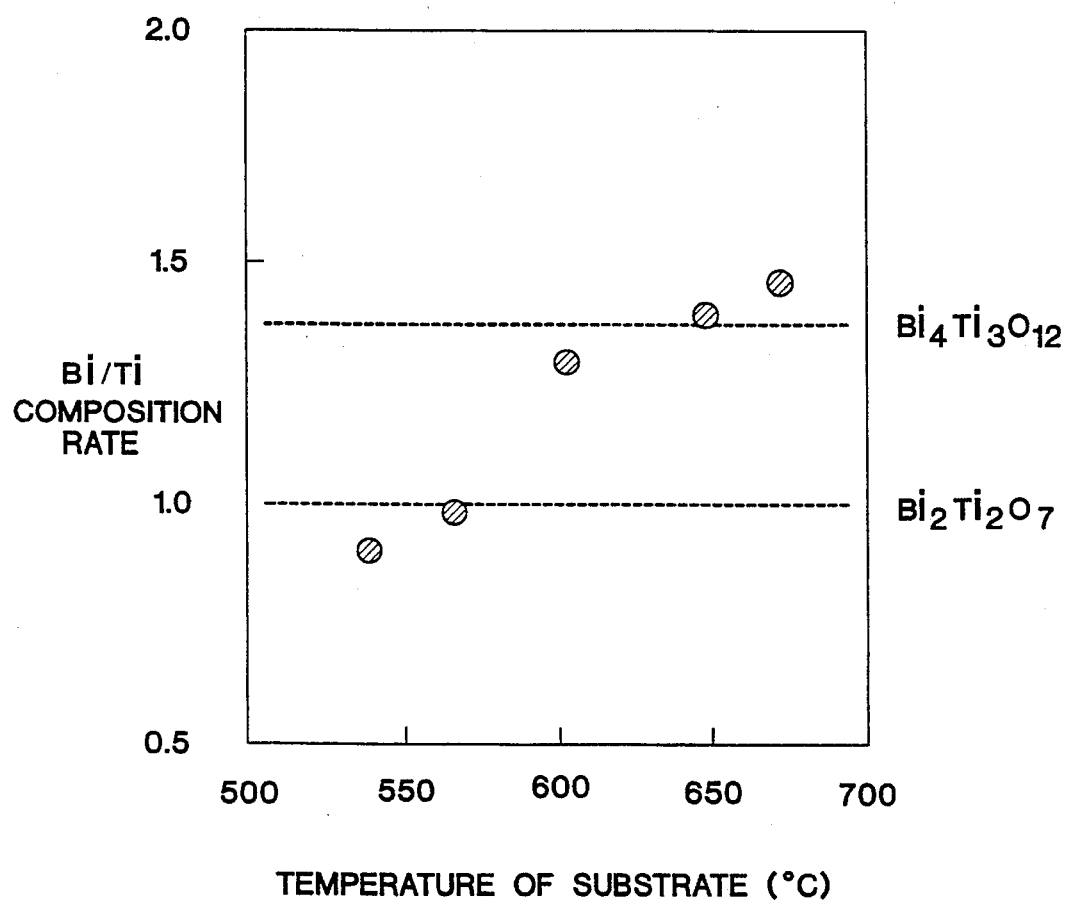
FIG. 7 is a view showing a dependency of Bi/Ti composition ratio used in Example 3 on the temperature of substrate.

It was confirmed that when temperature of the substrate is varied under these conditions, the composition of the film was changed and the phase of the ferroelectric thin film can be selected as shown in FIG. 7. The layered perovskite structure ($Bi_4Ti_3O_{12}$) was obtained at about 640° C. and pyrochlore structure ($Bi_2Ti_2O_7$) at about 560° C. This phenomenon can be also expected from the variation of deposition rate of Bi depending on substrate temperature.

As described in Example 2, a film of which a composition ratio is continuously varied was formed by gradually changing temperature of the substrate from 560° C. to 640° C. when forming the film. In this step, the film was grown by setting temperature of substrate at 560° C. for 5 minutes, followed by raising the temperature to 640° C. during 15 minutes and grown further for 80 minutes.

The presence of $Bi_4Ti_3O_{12}$ and $Bi_2Ti_2O_7$ was confirmed from X-ray diffraction pattern of the resulting film. The SEM photograph of the surface showed that the resulting film is sufficiently densed and its surface is smooth compared with $Bi_4Ti_3O_{12}$ single film.

According to the substrate providing the ferroelectric crystal thin film of the present invention, densed and smooth ferroelectric crystal thin film, which can not be obtained from the single layer of the ferroelectric crystal thin film, is realized because the ferroelectric crystal thin film comprising $Bi_4Ti_3O_{12}$ is formed on the electrode through the intermediary of the buffer layer which is formed on the semiconductor single crystal substrate. In other words, the substrate of the present invention employs a paraelectric crystal thin film having a pyrochlore structure which shows an isotropy as a buffer layer against a ferroelectric crystal thin film having a perovskite layered structure which shows a strong anisotropy, whereby crystal particles of the ferroelectric crystal thin film formed thereon can be minimized in size and the smooth surface can be realized.

In case where the buffer layer is a composition oxide containing Bi and Ti, the elements constituting the buffer layer are the same as that of the ferroelectric crystal thin film, so that contamination with different impurities can be avoided, whereby the substrate providing the ferroelectric crystal thin film can be obtained with more excellent ferroelectric characteristics.

What we claim is:

1. A substrate providing a ferroelectric crystal thin film, comprising:

a semiconductor single crystal substrate;

an electrode formed on said substrate;

a buffer layer on said electrode, wherein said buffer layer contains Bi, Ti, and O, and continuously varies in its composition of Bi, Ti and O from $Bi_2Ti_2O_7$ to $Bi_4Ti_3O_{12}$ in a direction from the electrode to the ferroelectric crystal thin film; and a ferroelectric crystal thin film comprising $Bi_4Ti_3O_{12}$ formed on said buffer layer.

2. A substrate according to claim 1, further comprising an upper electrode formed on the ferroelectric crystal thin film.

3. A substrate according to claim 1, wherein said buffer layer includes at least one crystalline layer, each crystalline layer consisting of a composite oxide containing Bi and Ti.

4. A substrate according to claim 3, wherein said at least one crystalline layer consists of $Bi_2Ti_2O_7$.

5. A substrate according to claim 1, further including at least one insulating film between said electrode and said semiconductor single crystal substrate.

6. A substrate according to claim 1, further including at least one conductive film between said electrode and said semiconductor single crystal substrate.

* * * * *